US012812790B2

(12) United States Patent
Nishihara

(10) Patent No.: US 12,812,790 B2
(45) Date of Patent: Nov. 24, 2026

(54) SEMICONDUCTOR DEVICE AND METHOD FOR MANUFACTURING SEMICONDUCTOR DEVICE

(71) Applicant: Mitsubishi Electric Corporation, Tokyo (JP)

(72) Inventor: Tatsuto Nishihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 309 days.

(21) Appl. No.: 18/729,395

(22) PCT Filed: Jun. 1, 2022

(86) PCT No.: PCT/JP2022/022338
§ 371 (c)(1),
(2) Date: Jul. 16, 2024

(87) PCT Pub. No.: WO2023/233591
PCT Pub. Date: Dec. 7, 2023

(65) Prior Publication Data
US 2025/0105197 A1 Mar. 27, 2025

(51) Int. Cl.

| | |
|---|---|
| ***H05K 1/183*** | (2026.01) |
| ***H05K 1/181*** | (2026.01) |
| *H10W 70/685* | (2026.01) |
| *H10W 72/00* | (2026.01) |
| *H10W 72/30* | (2026.01) |
| *H10W 90/00* | (2026.01) |

(52) U.S. Cl.
CPC ............. *H05K 1/183* (2013.01); *H05K 1/181* (2013.01); *H05K 2201/09036* (2013.01); *H10W 70/685* (2026.01); *H10W 72/07331* (2026.01); *H10W 72/352* (2026.01); *H10W 90/734* (2026.01); *H10W 90/754* (2026.01)

(58) Field of Classification Search
None
See application file for complete search history.

(56) References Cited

U.S. PATENT DOCUMENTS 11,239,196 B2 * 2/2022 Shiraki ................. H10W 20/48
2015/0115451 A1 4/2015 Viswanathan
2018/0153030 A1 5/2018 Viswanathan et al.

FOREIGN PATENT DOCUMENTS

JP H06-104350 A 4/1994
JP 2015-088757 A 5/2015

OTHER PUBLICATIONS

International Search Report issued in PCT/JP2022/022338; mailed Jul. 26, 2022.

* cited by examiner

*Primary Examiner* — Nicholas J Tobergte
(74) *Attorney, Agent, or Firm* — Studebaker Brackett PLLC

(57) ABSTRACT

A semiconductor device according to the disclosure includes a circuit substrate that includes a first conductor layer and an insulating layer laminated on the first conductor layer, an opening being formed in a top face of the circuit substrate such that the first conductor layer becomes a bottom face of the opening, a sintered material filling the opening, and a semiconductor chip provided over the sintered material and electrically connected to the first conductor layer via the sintered material, wherein a width of the opening is larger than a width of the semiconductor chip.

9 Claims, 5 Drawing Sheets

SEMICONDUCTOR DEVICE AND METHOD FOR MANUFACTURING SEMICONDUCTOR DEVICE

FIELD

The present disclosure relates to a semiconductor device and a method for manufacturing the semiconductor device.

BACKGROUND

PTL 1 discloses a semiconductor device package. A first material part of the semiconductor device package contains one selected from between ceramics and an organic material. A second material part of the semiconductor device package contains a metal material. A sintered silver region is arranged so as to link together the first material part and the second material part.

CITATION LIST

Patent Literature

[PTL 1] JP 2015-88757 A

SUMMARY

Technical Problem

Due to a transition from GaAs substrates to GaN substrates, semiconductor devices offered have higher outputs. A problem arising in association therewith is dissipation of heat generated in operations of semiconductor chips. If the heat dissipation is not sufficient, there is a possibility that the semiconductor chips may have a malfunction or may be damaged. In order to stably achieve desired characteristics and to enhance reliability, heat dissipation of the semiconductor chips is an important issue.

In PTL 1, a substrate is provided with a hole part so that sintered silver is formed in a hole. In that situation, the heat from a semiconductor chip is dissipated via the sintered silver. However, PTL 1 does not indicate a specific method for forming the sintered silver in the hole of the substrate. Generally speaking, to obtain sintered silver, which is a metal body, a paste material obtained by mixing fine particle silver with a solvent is used. The paste is applied to the inside of the hole of the substrate: heat is applied to volatilize the solvent contained in the paste; and heat is further applied to sinter the fine particle silver. Thus, the sintered silver in the form of the metal body is obtained. To form the sintered silver in the hole of the substrate, it is necessary to close at least one side of the hole part, so as to prevent the paste from flowing out of the hole part at the time of applying the paste. This procedure has the risk of making manufacturing steps complicated.

It is an object of the present disclosure to provide a semiconductor device that can easily be manufactured and a method for manufacturing the semiconductor device.

Solution to Problem

A semiconductor device according to the disclosure includes a circuit substrate that includes a first conductor layer and an insulating layer laminated on the first conductor layer, an opening being formed in a top face of the circuit substrate such that the first conductor layer becomes a bottom face of the opening, a sintered material filling the opening, and a semiconductor chip provided over the sintered material and electrically connected to the first conductor layer via the sintered material, wherein a width of the opening is larger than a width of the semiconductor chip.

A method for manufacturing a semiconductor device according to the disclosure includes filling, with a sintering paste, an opening formed in a top face of a circuit substrate that includes a first conductor layer and an insulating layer laminated on the first conductor layer, the opening being formed such that the first conductor layer becomes a bottom face of the opening, mounting a semiconductor chip on a liquid surface of the sintering paste and heating the circuit substrate after the semiconductor chip is mounted so as to sinter the sintering paste to obtain a sintered material, so that the first conductor layer is electrically connected to the semiconductor chip via the sintered material, wherein a width of the opening is larger than a width of the semiconductor chip.

Advantageous Effects of Invention

In the semiconductor device and the method for manufacturing the semiconductor device according to the present disclosure, an opening is formed in a top face of a circuit substrate such that a first conductor layer becomes a bottom face of the opening. It is possible to easily manufacture the semiconductor device by filling the opening with a sintered material.

DESCRIPTION OF EMBODIMENTS

Figure 1:
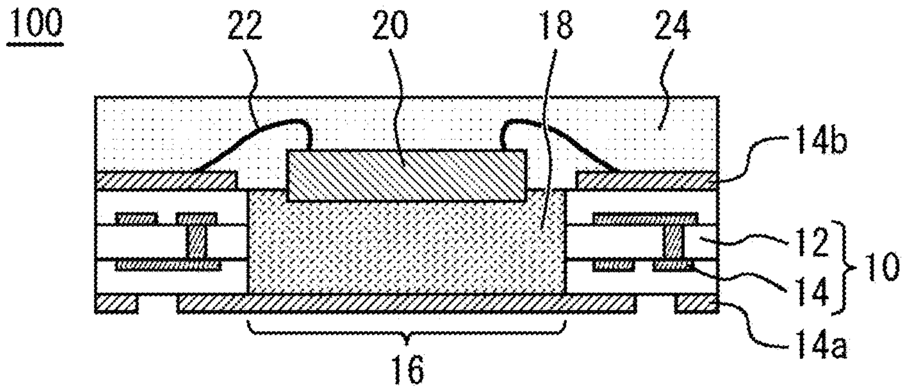
FIG. 1 is a cross-sectional view of a semiconductor device according to a first embodiment.

A semiconductor device and a method for manufacturing a semiconductor device according to each embodiment are described with reference to drawings. Identical or corresponding constitutional elements are given the same reference numerals, and the repeated description of such constitutional elements may be omitted.

First Embodiment

FIG. 1 is a cross-sectional view of a semiconductor device 100 according to a first embodiment. The semiconductor device 100 includes a circuit substrate 10 having multi-layer wirings. In the circuit substrate 10, a plurality of conductor layers 14 and a plurality of insulating layers 12 are laminated alternately. Of the circuit substrate 10, the lowermost layer is a conductor layer 14*a*, whereas the uppermost layer is a conductor layer 14*b*. The structure of the circuit substrate 10 is not limited to the structure shown in FIG. 1. Any structure is acceptable as long as at least the conductor layer 14*a* and an insulating layer 12 laminated on the conductor layer 14*a* are included.

An opening 16 is formed in the top face of the circuit substrate 10 such that the conductor layer 14*a* becomes the bottom face of the opening 16. The opening 16 is filled with a sintered material 18. The sintered material 18 contains silver, for example. The sintered material 18 is sintered silver, for example. A semiconductor chip 20 is provided over the sintered material 18. The semiconductor chip 20 is electrically connected to the conductor layer 14*a* via the sintered material 18. In this manner, the conductor layer 14*a* forming the bottom face of the opening 16 serves as a die pad part.

The width of the opening 16 is larger than the width of the semiconductor chip 20. In other words, in a planar view, the semiconductor chip 20 is within the opening 16. In the horizontal direction, the dimension of the opening 16 may be equal to the exterior dimension of the semiconductor chip 20. Further, as shown in FIG. 1, a part of the lateral face of the semiconductor chip 20 may be covered by the sintered material 18.

The semiconductor chip 20 is connected to the conductor layer 14*b* via a wire 22. The top face of the circuit substrate 10 and the semiconductor chip 20 are sealed by a mold material 24.

Figure 2:
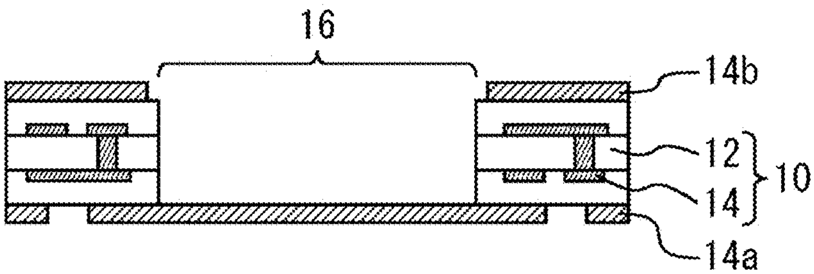
FIG. 2 is a drawing showing the method for manufacturing the semiconductor device according to the first embodiment.
Figure 3:
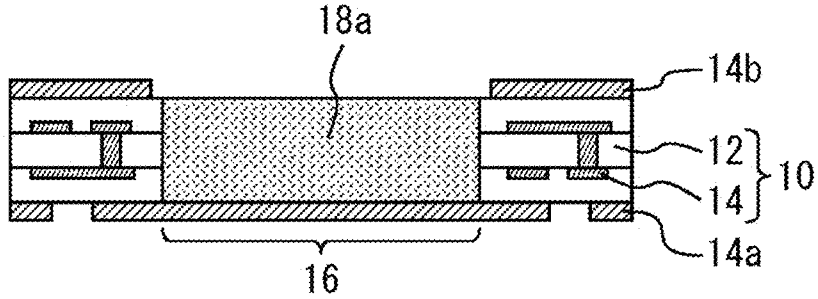
FIG. 3 is a drawing showing the method for manufacturing the semiconductor device according to the first embodiment.

Next, a method for manufacturing the semiconductor device 100 according to the present embodiment will be explained. FIGS. 2 to 5 are drawings showing the method for manufacturing the semiconductor device 100 according to the first embodiment. To begin with, as shown in FIG. 2, the opening 16 is formed in the top face of the circuit substrate 10. Subsequently, as shown in FIG. 3, the opening 16 is filled with a sintering paste 18*a*. For the filling process using the sintering paste 18*a*, it is possible to use a dispensing method or a printing method. The filling of the sintering paste 18*a* comes up to a height equal to or lower than the top face of the circuit substrate 10.

The sintering paste 18*a* is a material in a paste form obtained by mixing fine particle silver with a solvent. The sintering paste 18*a* may be a material obtained by adding resin such as epoxy to the fine particle silver and the solvent and mixing together. In place of the fine particle silver, it is also acceptable to use fine particle gold, fine particle copper, or the like. As explained herein, materials that can be used in the sintered material 18 are not limited to silver.

Figure 4:
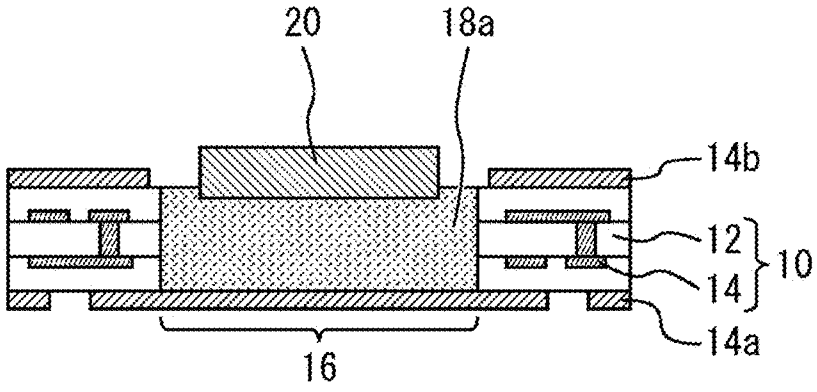
FIG. 4 is a drawing showing the method for manufacturing the semiconductor device according to the first embodiment.

Subsequently, as shown in FIG. 4, the semiconductor chip 20 is mounted on the liquid surface of the sintering paste 18*a*. In this situation, a structure may be adopted in which a part of the semiconductor chip 20 is embedded in the sintering paste 18*a*, while a part of the lateral face of the semiconductor chip 20 is covered by sintering paste 18*a*.

After the semiconductor chip 20 is mounted, the circuit substrate 10 is heated, so as to sinter the sintering paste 18*a* to obtain the sintered material 18. In this manner, the conductor layer 14*a* is electrically connected to the semiconductor chip 20 via the sintered material 18. The heating process is performed at a temperature of 250° C. or lower by using heating means (not shown). The solvent is volatilized by the heating process. When the heating process is further continued, the fine particle silver is sintered so as to form the sintered silver in the form of the metal body. The temperature for heating the sintering paste 18*a* is preferably 210° C. or lower and, more preferably, 190° C. or lower.

When the solvent has been volatilized by heating the sintering paste 18*a*, the fine particle silver is sintered and adjoined with a metal layer such as a gold plating film formed on the surface of the conductor layer 14*a*. Further, the fine particle silver is also sintered and adjoined with another metal layer such as a gold sputtered film formed on the bottom face of the semiconductor chip 20. As a result, the semiconductor chip 20 is fixed onto and is electrically and thermally connected to the conductor layer 14*a*, via the sintered material 18 which has become the sintered silver in the form of the metal body.

Figure 5:
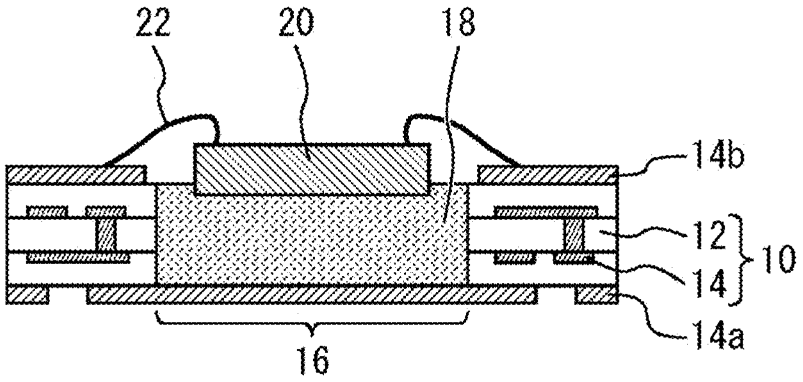
FIG. 5 is a drawing showing the method for manufacturing the semiconductor device according to the first embodiment.

After that, as shown in FIG. 5, an electrode provided on the top face of the semiconductor chip 20 is connected via the wire 22 to a pattern of the circuit substrate 10. The pattern of the circuit substrate 10 corresponds to the conductor layer 14*b*. Thus, an electric circuit of the semiconductor device 100 has been structured. In addition, to protect the semiconductor chip 20 and the wire 22 from external force, the mold material 24 using epoxy resin or the like is formed.

Next, comparison examples of the present embodiment will be explained. Generally speaking, in semiconductor devices, component parts such as semiconductor chips are mounted on component-receiving substrates by using a die attachment material such as conductive epoxy resin. Organic substrates of glass epoxy or the like used as such component-receiving substrates have lower thermal conductivity and a lower heat dissipation capability, compared to metals such as iron or copper. Also, thermal conductivity of ceramic substrates using alumina or the like is not sufficient, either, for dissipating heat from semiconductor chips generally having high outputs.

Figure 6:
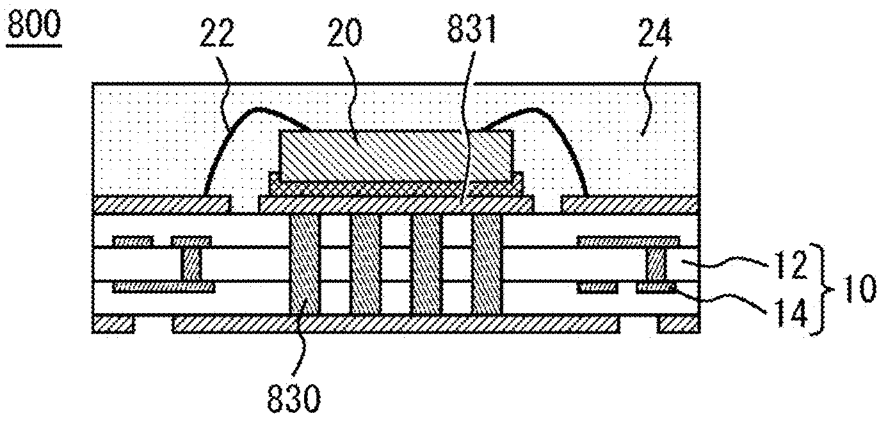
FIG. 6 is a cross-sectional view of a semiconductor device according to a first comparison example.

FIG. 6 is a cross-sectional view of a semiconductor device 800 according to a first comparison example. In the semiconductor device 800, a die pad 831 for having the semiconductor chip 20 mounted thereon is provided on the top face of the circuit substrate 10. Underneath the die pad 831, a plurality of through holes are formed so as to penetrate the circuit substrate 10 from the top face to the bottom face thereof. The lateral walls of the through holes are copper plated, and the through holes are filled with a paste 830 having high thermal conductivity. With this arrangement, heat generated by the semiconductor chip 20 is dissipated to a mother board via the through holes.

Figure 7:
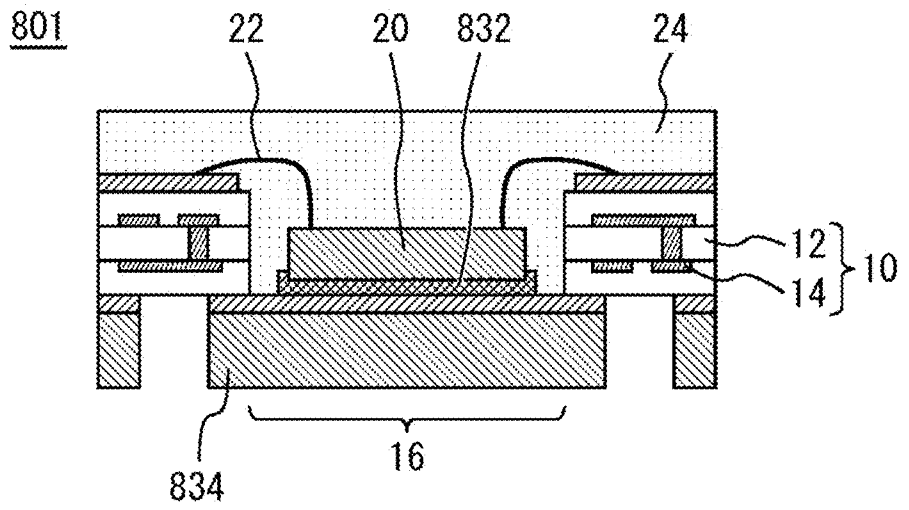
FIG. 7 is a cross-sectional view of a semiconductor device according to a second comparison example.

FIG. 7 is a cross-sectional view of a semiconductor device 801 according to a second comparison example. The semiconductor device 801 is assumed to be a semiconductor device having a higher output than the semiconductor device 800. In the semiconductor device 801, the opening 16 is formed in a substrate. The semiconductor chip 20 is mounted on a conductor exposed through the opening 16. In addition, thick copper plating 834 is applied to the bottom face of the circuit substrate 10. The copper plating 834 functions as a heat sink. With this arrangement, it is possible to dissipate heat generated by the semiconductor chip 20 to a mother board without the intermediation of through holes.

Figure 8:
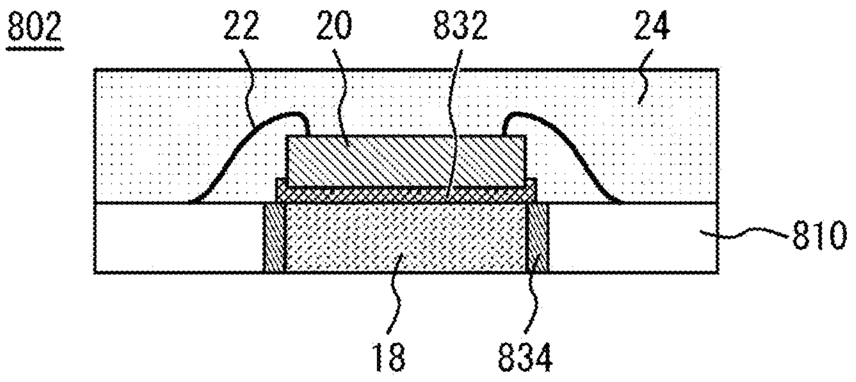
FIG. 8 is a cross-sectional view of a semiconductor device according to a third comparison example.
Figure 9:
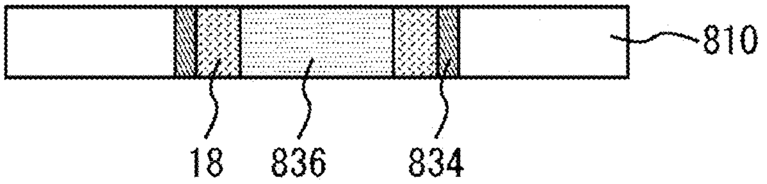
FIG. 9 is a cross-sectional view of the circuit substrate according to a fourth comparison example.

FIG. 8 is a cross-sectional view of a semiconductor device 802 according to a third comparison example. FIG. 8 shows an example obtained by further improving the semiconductor devices 800 and 801. In the semiconductor device 802, a circuit substrate 810 is provided with a hole part, so that the sintered material 18, which is sintered silver, is formed in the hole part. FIG. 9 is a cross-sectional view of the circuit substrate 810 according to a fourth comparison example. In the fourth comparison example, the sintered material 18 and copper slag 836 are housed in a hole part of the circuit substrate 810. Heat generated by the semiconductor chip 20 is dissipated, via a die attachment material 832 and the sintered material 18 in the third comparison example and via the die attachment material 832, the copper slag 836, and the sintered material 18 in the fourth comparison example.

Generally speaking, however, to form such sintered silver in a hole of a substrate, a paste containing fine particle silver is applied to the inside of the hole and sintered. On such occasion, it is necessary to prevent the paste from flowing out and the copper slag from spurting out or falling down. For this reason, it is necessary to close at least one side of the hole part, which has the risk of making manufacturing steps complicated. In addition, the solvent contained in the paste is volatilized by the heating process. For this reason, there is a possibility that the sintered silver after the heating process may be thinner than the circuit substrate 810 due to shrinking. In other words, there is a possibility that a gap may be formed between the circuit substrate 810 and the sintered material 18. For this reason, there is a possibility that it may be difficult to keep the sintered material 18 in excellent contact with the semiconductor chip 20.

Figure 10:
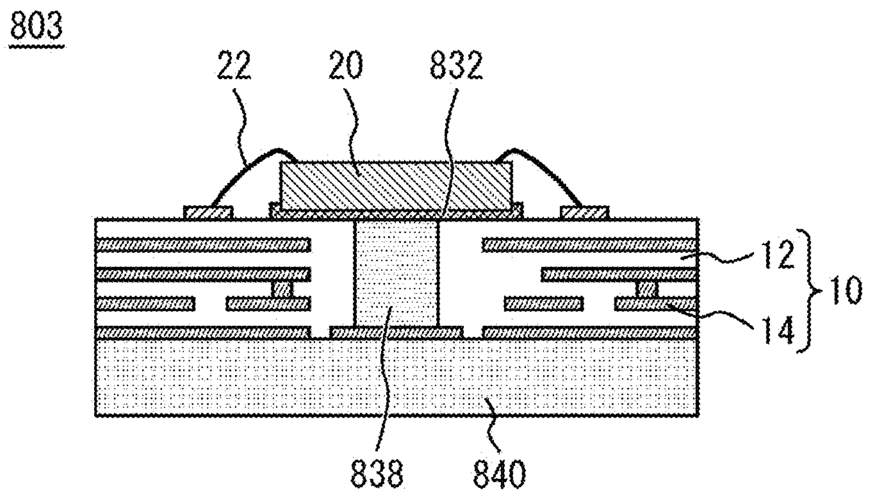
FIG. 10 is a cross-sectional view of a semiconductor device according to a fifth comparison example.

FIG. 10 is a cross-sectional view of a semiconductor device 803 according to a fifth comparison example. FIG. 10 shows an example obtained by further improving the semiconductor device 802. In the semiconductor device 803, the circuit substrate 10 having thin-film multi-layer wirings is provided on a base substrate 840. A mount region for the semiconductor chip 20 is provided in the top face of the circuit substrate 10. In the mount region of the circuit substrate 10, a through hole reaching the base substrate 840 is formed. The through hole is filled with a highly thermally conductive body 838 such as a silver paste that can be baked at 600° C. or lower. The width of the through hole is smaller than the width of the semiconductor chip 20 and is, preferably, equal to or smaller than one-third. In the semiconductor device 803, heat generated by the semiconductor chip 20 is dissipated to the base substrate 840, via the die attachment material 832 and the highly thermally conductive body 838.

However, because the highly thermally conductive body 838 is baked at 600° C. or lower, organic materials such as glass epoxy having a pyrolysis temperature in the range of approximately 350° C. to 450° C. cannot be used in the insulating layer 12 of the circuit substrate 10. For this reason, possible materials of the insulating layer 12 are limited to polyimide resin and the like. Further, for example, when a transistor is placed to be wide in a horizontal direction like a high output Field Effect Transistor (FET), there is a wide heat-generating region. In the semiconductor device 803, heat from portions other than those immediately above the through hole in the semiconductor chip 20 is dissipated via the insulating layer of the circuit substrate 10. For this reason, there is a possibility that the heat may not be sufficiently dissipated.

Next, advantageous effects of the present embodiment will be explained. In the present embodiment, the opening 16 is formed in the top face of the circuit substrate 10 such that the conductor layer 14*a* becomes the bottom face of the opening 16. The opening 16 is filled with the sintered material 18. Accordingly, there is no need to perform the step of closing the hole part, unlike in the third and the fourth comparison examples. Consequently, it is possible to easily manufacture the semiconductor device 100. In addition, in the present embodiment, instead of mounting the semiconductor chip 20 on the heat-treated sintered silver, the sintered material 18 gets sintered after the semiconductor chip 20 is mounted. With this arrangement, it is possible to perform the process of forming the sintered material 18 and the process of connecting the semiconductor chip 20 to the conductor layer 14*b* in the one session of heating process. As a result, it is possible to manufacture the semiconductor device 100 even more easily.

Further, because the sintered material 18 that has become the sintered silver in the form of the metal body has high thermal conductivity, the sintered material 18 also functions as a heat sink. For this reason, it is possible to efficiently dissipate the heat from the semiconductor chip 20. In addition, the exterior dimension of the opening 16 in the horizontal direction is equal to or larger than the exterior dimension of the semiconductor chip 20 in the horizontal direction. As a result, almost the entire part of the bottom face of the semiconductor chip 20 is in contact with the sintered material 18. Accordingly, it is possible to efficiently and sufficiently dissipate heat from every section of the bottom face of the semiconductor chip 20. Consequently, it is possible to achieve stable characteristics and reliability.

Further, it is also acceptable to selectively build a heat sink using the sintered material 18 in an arbitrary section of the circuit substrate 10 that requires the heat dissipation. With this arrangement, it is possible to omit a heat sink such as that in the second comparison example. Consequently, it is possible to manufacture the semiconductor device 100 at a low cost. In addition, it is possible to keep the semiconductor device 100 thin and lightweight.

The present embodiment is not provided with the die pad 831 shown in the comparison example. Also, a part of the semiconductor chip 20 is embedded in the sintered material 18. Furthermore, the sintered material 18 shrinks toward the conductor layer 14*a*. For this reason, in comparison to the first to the fifth comparison examples, it is possible to reduce the height difference between the top face of the semiconductor chip 20 and the conductor layer 14*b*. Accordingly, it is possible to keep the height and the length of the wire 22 small. It is therefore possible to keep variations small in the heights and the lengths of the wires 22. Consequently, it is possible to keep variations small in high-frequency characteristics, which are sensitive to changes in the heights and the lengths of the wires 22.

Further, because the height difference between the top face of the semiconductor chip 20 and a pattern surface of the circuit substrate 10 is kept small, it is possible to keep the height of the mold material 24 small and to thus prevent air bubbles from being enclosed at the time of injecting the mold material 24. In addition, because the wire 22 is formed to be low and short, it is possible to prevent the wire 22 from being deformed at the time of forming the mold material 24.

For example, the thickness of the conductor layer 14*a* serving as the die pad part is 50 μm or smaller, is preferably 35 μm, and is more preferably 18 μm. The thickness of the conductor layer 14*a* affects an arrangement pitch between input/output terminals of the semiconductor device 100. The thinner the conductor layer 14*a* is, the narrower the arrangement pitch between the input/output terminals can be.

The circuit substrate 10 may have a plurality of semiconductor chips 20 mounted thereon. In that situation, it is suggested that the opening 16 and the sintered material 18 of the present embodiment be provided below each of the semiconductor chips 20.

These modifications can be applied, as appropriate, to semiconductor devices and method s for manufacturing the semiconductor devices according to the following embodiments. Note that the semiconductor devices and the methods for manufacturing the semiconductor devices according to the following embodiments are similar to those of the first embodiment in many respects, and thus differences between the semiconductor devices and the methods for manufacturing the semiconductor devices according to the following embodiments and those of the first embodiment will be mainly described below.

Second Embodiment

Figure 11:
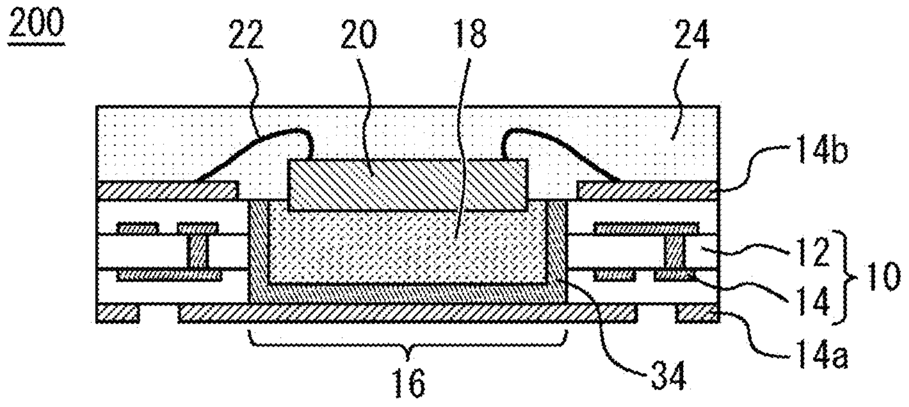
FIG. 11 is a cross-sectional view of a semiconductor device according to a second embodiment.

FIG. 11 is a cross-sectional view of a semiconductor device 200 according to a second embodiment. In the semiconductor device 200 according to the present embodiment, the lateral face of the circuit substrate 10 forming the opening 16 is covered by a metal film 34. Further, of the conductor layer 14*a*, the part forming the bottom face of the opening 16 is also covered by the metal film 34. The other configurations are the same as those in the first embodiment. For example, the metal film 34 may be a copper plating layer. In addition, in the second embodiment, it is preferable to make the width of the sintered material 18 larger than the width of the semiconductor chip 20.

As a result of being sintered in the heating process, the sintering paste 18*a* is sintered and adjoined with a metal layer of a gold plating film or the like formed on the surface of the metal film 34. As a result, in addition to the bottom face of the opening 16, the sintering/adjoining phenomenon also occurs on the lateral face of the opening 16. Accordingly, it is possible to prevent a gap from being formed between the lateral face of the opening 16 and the sintered material 18. Consequently, it is possible to enhance durability against expansion/contraction due to temperature changes caused by reflow or the like and against mechanical bending. The present embodiment is particularly effective when the sintering paste 18*a* is configured by using fine particle silver and a solvent.

Third Embodiment

Figure 12:
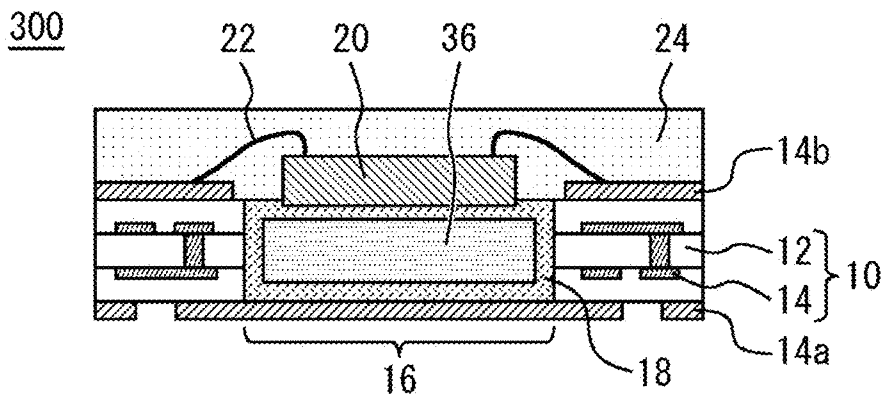
FIG. 12 is a cross-sectional view of a semiconductor device according to a third embodiment.

FIG. 12 is a cross-sectional view of a semiconductor device 300 according to a third embodiment. In the semiconductor device 300, a metal body 36 is housed in the opening 16. For example, it is suggested that the metal body 36 be formed by using copper, which is less expensive than silver, has a higher elastic modulus than silver, and has high thermal conductivity. The gap between the metal body 36, the lateral face of the circuit substrate 10, the conductor layer 14*a*, and the semiconductor chip 20 is filled with the sintered material 18. The other configurations are the same as those in the first embodiment.

It is acceptable to use any means to realize the structure shown in FIG. 12. For example, it is acceptable to fill the opening 16 with the sintering paste 18*a*, before immersing the metal body 36 in the sintering paste 18*a*. In another example, it is acceptable to apply the sintering paste 18*a* to the conductor layer 14*a* serving as the bottom face of the opening 16, to further place the metal body 36 on the applied sintering paste 18*a*, and to subsequently fill the gap with the sintering paste 18*a* so as to cover the metal body 36.

As a result of having the metal body 36 housed in the opening 16, the amount of the sintering paste 18*a* used as the filling is smaller than that in the first embodiment. In other words, the shrinkage at the time of heating the sintering paste 18*a* so as to volatilize the solvent and to sinter the fine particle silver is smaller. As a result, it is possible to keep variations small in the heights of the top faces of the semiconductor chips 20 fixed to the sintered material 18. Further, when the circuit substrate 10 has a large number of openings 16 or when the opening 16 has a large area, there is a possibility that the mechanical strength of the circuit substrate 10 may be lowered. However, because the opening 16 has housed therein the metal body 36 having high thermal conductivity, it is possible to prevent the mechanical strength from being lowered.

Fourth Embodiment

Figure 13:
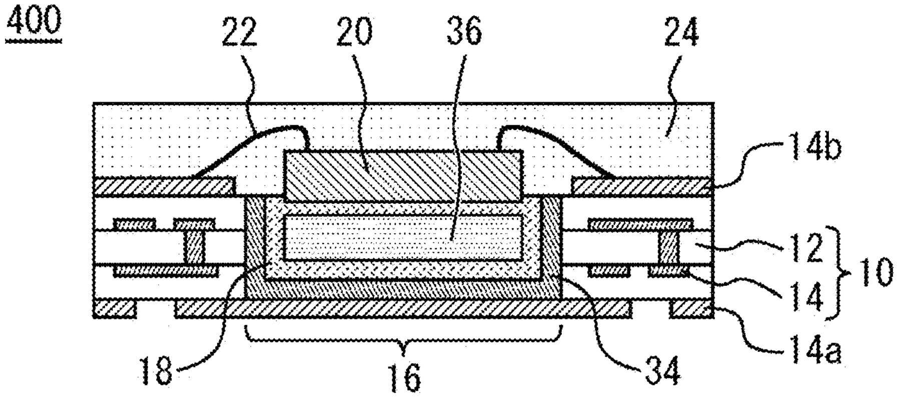
FIG. 13 is a cross-sectional view of a semiconductor device according to a fourth embodiment.

FIG. 13 is a cross-sectional view of a semiconductor device 400 according to a fourth embodiment. In the semiconductor device 400, the lateral face of the circuit substrate 10 forming the opening 16 is covered by the metal film 34. In addition, the metal body 36 is housed in the opening 16. The other configurations are the same as those in the first embodiment. In this manner, it is possible to achieve the advantageous effects of the second and the third embodiments.

The technical features described in the embodiments may be used in combination as appropriate.

REFERENCE SIGNS LIST

10 circuit substrate, 12 insulating layer, 14, 14*a*, 14*b* conductor layer, 16 opening, 18 sintered material, 18*a* sintering paste, 20 semiconductor chip, 22 wire, 24 mold material, 34 metal film, 36 metal body, 100, 200, 300, 400 semiconductor device

The invention claimed is:

1. A semiconductor device comprising:

a circuit substrate that includes a first conductor layer and an insulating layer laminated on the first conductor layer, an opening being formed in a top face of the circuit substrate such that the first conductor layer becomes a bottom face of the opening;

a sintered material filling the opening; and a semiconductor chip provided over the sintered material and electrically connected to the first conductor layer via the sintered material, wherein a width of the opening is larger than a width of the semiconductor chip, and a part of a lateral face of the semiconductor chip is covered by the sintered material.

2. The semiconductor device according to claim 1, wherein the sintered material contains silver.

3. The semiconductor device according to claim 1, wherein the semiconductor chip is connected, via a wire, to a second conductor layer provided in an uppermost layer of the circuit substrate.

4. The semiconductor device according to claim 1, comprising:

a mold material sealing the top face of the circuit substrate and the semiconductor chip.

5. The semiconductor device according to claim 1, wherein a lateral face of the circuit substrate forming the opening is covered by a metal film.

6. The semiconductor device according to claim 1, wherein the opening houses a metal body therein.

7. The semiconductor device according to claim 6, wherein the metal body is formed by using copper.

8. The semiconductor device according to claim 1, wherein a lateral face of the circuit substrate forming the opening is covered by a metal film, and the opening houses a metal body therein.

9. A method for manufacturing a semiconductor device, comprising:

filling, with a sintering paste, an opening formed in a top face of a circuit substrate that includes a first conductor layer and an insulating layer laminated on the first conductor layer, the opening being formed such that the first conductor layer becomes a bottom face of the opening;

mounting a semiconductor chip on a liquid surface of the sintering paste; and heating the circuit substrate after the semiconductor chip is mounted so as to sinter the sintering paste to obtain a sintered material, so that the first conductor layer is electrically connected to the semiconductor chip via the sintered material, wherein a width of the opening is larger than a width of the semiconductor chip, and a part of a lateral face of the semiconductor chip is covered by the sintered material.

* * * * *